(12) United States Patent
Yamauchi

(10) Patent No.: US 6,642,124 B1
(45) Date of Patent: Nov. 4, 2003

(54) SEMICONDUCTOR DEVICE AND MANUFACTURING METHOD THEREOF

(75) Inventor: Michiko Yamauchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 394 days.

(21) Appl. No.: 09/604,681

(22) Filed: Jun. 27, 2000

(30) Foreign Application Priority Data

Nov. 8, 1999 (JP) .......................................... 11-317024

(51) Int. Cl.[7] ............................................... H01L 21/76
(52) U.S. Cl. ..................... 438/425; 438/424; 438/166; 438/439; 438/435; 438/443
(58) Field of Search ................. 438/424, 439, 438/166, 425, 435, 443

(56) References Cited

U.S. PATENT DOCUMENTS

| | | | | |
|---|---|---|---|---|
| 4,764,248 A | * | 8/1988 | Bhattacherjee et al. | 438/439 |
| 5,817,549 A | * | 10/1998 | Yamazaki et al. | 438/166 |
| 6,218,693 B1 | * | 4/2001 | Lu | 257/296 |
| 6,245,638 B1 | * | 6/2001 | Gardner et al. | 438/424 |
| 6,352,897 B1 | * | 3/2002 | Sung | 438/296 |

OTHER PUBLICATIONS

Atsuki Ono et al., "Suppression of Vth fluctuation by minimizing transient enhanced diffusion for deep sub–quarter micron MOSFET," IEDM 96, pp. 755–758; 1996.

C.S. Rafferty et al., "Explanation of Reverse Short Channel Effect by Detect Gradients," 1993 IEEE, pp. 311–314.

Atsuki Ono et al., "TED Control Technology for Suppression of Reverse Narrow Channel Effect in 0.1 um MOS Devices," 1997 IEEE, p. 227–230.

Bikas Maiti et al., "Reoxidized Nitric Oxide )ReoxNO), Process and its Effect on the Dielectric Reliability of the LOCOS Edge," 1995 Symposium on VLSI Technology Digest of Technical Papers, pp. 63 and 64.

* cited by examiner

Primary Examiner—Matthew Smith
Assistant Examiner—V. Yevsikov

(57) ABSTRACT

The present invention provides a semiconductor device that reduces the junction leak current and achieves an improvement in the reliability of the gate oxide film by minimizing divot formation and the occurrence of a kink and a method of manufacturing such a semiconductor device. A pad oxide film and a silicon nitride film are formed on an Si substrate and a groove-like trench is formed through photolithography and etching. The liner oxide of the trench are oxidized through oxidizing/nitriding. Then, the trench is filled with an insulating film, the insulating film is planarized and the silicon nitride film and the pad oxide film are removed. Next, a field area is formed and a transistor is formed by following specific steps. By forming a trench liner oxide film containing nitrogen, stress is reduced.

6 Claims, 12 Drawing Sheets

SEMICONDUCTOR DEVICE AND MANUFACTURING METHOD THEREOF

BACKGROUND OF THE INVENTION

The present invention relates to a structure of an element isolation region in a semiconductor device and a semiconductor device manufacturing method.

In a semiconductor device having silicon as its main constituent, an element isolation region (hereafter referred to as a field area) is formed through the LOCOS (local oxidation of silicon) method or the STI (shallow trench isolation) method to electrically isolate elements in the prior art. An area other than the field area is referred to as an active area, and the elements are formed in the active area. When a field area is formed through the LOCOS method, a bird's beak is formed at an end of the field area, reducing the size of the area that can be utilized as active area. With further miniaturization of elements achieved in recent years, the width and the pitch of the active area have become smaller and the use of the LOCOS method to form the field area is problematic. In contrast, the STI method, which by its nature creates hardly any bird's beak, is considered to be a more viable method of field area formation, achieving reduced conversion difference. FIG. 7 illustrates the STI manufacturing method. As shown in FIG. 7(a), a groove referred to as a trench 7 is formed at a Si substrate 1. Then, as illustrated in FIG. 7(b), a trench liner oxide film 71 is formed at the insidewalls of the trench 7 and the trench is filled with an embedded insulating film 72 such as a CVD oxide film to form a field area.

However, when the field area is formed by adopting the manufacturing method described above, a groove referred to as a divot 81, as shown in FIG. 8, is formed at the surface of the field area near the boundary with the active area. As a result, the edge of the active area adjacent to the divot 81 becomes exposed. FIG. 8 is an enlarged view of the area around the edge. When this area becomes exposed, numerous problems arise with regard to the occurrence of stress which is to be detailed later.

When a field area is formed through the STI method, the embedded insulating film 72 and the Si substrate 1 become expanded during the heat treatment performed after the trench is filled with the embedded insulating film 72. Since the embedded insulating film 72 and the Si substrate 1 have different coefficients of expansion, stress occurs at their interface. In addition, stress also occurs at the interface of the trench liner oxide film 71 formed through thermal oxidation and the Si substrate 1 as a result of volumetric expansion caused by the oxygen atoms occupying space between the Si atoms. These stresses occur near the boundary of the active area and the field area, and a particularly intense stress occurs at the edges of the active area.

At the edge of an area of intense stress, accelerated diffusion of impurities occurs during the annealing process implemented after the impurity ion implantation and, as illustrated in FIG. 8, the impurity concentration at the edge becomes lowered compared to that around the center of the active area. If the edge becomes exposed as a result of divot formation, a parasitic transistor with a low threshold voltage is formed over the area with a low impurity concentration. In such a case, there will be a kink in the characteristics curve achieved by the transistor, as shown in FIG. 9. In FIG. 9, the vertical axis represents the drain current Id and the horizontal axis represents the gate voltage Vg. If there is no parasitic transistor present, the transistor characteristics curve is free of any kink. The presence of a kink results in electrical characteristics different from the design electrical characteristics, and thus, the transistor characteristics cannot be identified. In addition, since parasitic transistors and kinks manifesting under these circumstances are not uniform, the transistor characteristics cannot be determined with uniformity during the production, which, in turn, results in inconsistency in transistor characteristics.

Furthermore, occurrence of stress induces a dislocation, resulting in the formation of crystal defects. When the impurity concentration is reduced, a depletion layer is more readily extended compared to the other areas, to lead to an increase in the junction leak current of via the crystal defects.

An oxide film is not formed at the Si substrate isotropically and the direction in which the oxide film is formed varies depending upon the direction of the crystal. If the edge of the active area is exposed due to the formation of a divot, the thickness of the oxide film formed at the surface along the vertical direction of the edge becomes different from the thickness of the oxide film formed at the surface along the horizontal direction. The combination of this inconsistent oxide film thickness and the stress occurring at the edge causes the thickness of a gate oxide film 92 to become locally reduced over this area, as shown in FIG. 8. When the film thickness is reduced, the reliability of the gate oxide film 92 becomes an issue. In addition, the structure of this area is such that an electric field tends to concentrate in the area in the first place, and if the gate oxide film 92 becomes thinner over the area, more electric field concentrates through a synergistic effect. An electric field concentration is considered to be one of the causes of kinks and is, therefore, not desirable.

SUMMARY OF THE INVENTION

An object of the present invention, which has been completed by addressing the problems discussed above, is to provide a semiconductor device through which the junction leak current can be reduced and the reliability of the gate oxide film can be improved by minimizing divot formation and the occurrence of a kink, and a method of manufacturing the semiconductor device.

In order to achieve the object described above, in a first aspect of the present invention, a semiconductor device provided with a groove-like trench at the isolation region, with an oxide film containing nitrogen used to constitute a liner oxide film in the trench, is provided. By using an oxide film containing nitrogen to constitute the liner oxide film, the degree of distortion occurring in the structure within the oxide film can be lessened. In addition, the compressive stress in the trench liner oxide film, the stress at the edge of the active area and the tensile stress imparted to the Si substrate are all reduced. Thus, the formation of crystal defects, the junction leak current and the occurrence of a kink are minimized.

In a second aspect of the present invention, a semiconductor device provided with a groove-like trench located at an isolation region, with nitrogen contained in the composition of the surface of an isolation film within the trench, is provided. Since the HF resistance is improved by adopting this structure, divots are less likely to be formed during the subsequent HF process.

In a third aspect of the present invention, a semiconductor device provided with a groove-like trench located at an isolation region, with nitrogen contained in the composition of the surface of an isolation film within the trench and also in the composition of the surface of an element formation area, is provided. Since stresses are reduced over a wide range by adopting this structure, accelerated diffusion of impurities can be minimized, to ultimately prevent the formation of kinks. In addition, since the HF resistance is improved, divots are less likely to be formed during the subsequent HF process.

In a fourth aspect of the present invention, a semiconductor device manufacturing method comprising a step in which a pad oxide film and a silicon nitride film are formed on an Si substrate, a step in which a groove-like trench is formed through photolithography and etching, a step in which the liner oxide of the trench are oxidized by employing an oxidizing-nitriding method and a step in which the trench is filled with an insulating film and then after planarization, the silicon nitride film and the pad oxide film are removed, is provided. By using an oxide film containing nitrogen, the degree to which the structure within the oxide film becomes distorted can be lessened, so that the compressive stress occurring inside the trench liner oxide film, the stress occurring at the edge of the active area and the tensile stress imparted to the Si substrate are reduced to minimize the occurrence of crystal defects formation, junction leak current and the occurrence of a kink.

In addition, in a fifth aspect of the present invention, a semiconductor device manufacturing method comprising a step in which a pad oxide film and a silicon nitride film are formed on an Si substrate, a step in which a groove-like trench is formed through photolithography and etching, a step in which the insidewalls of the trench are oxidized, a step in which the trench is filled with an insulating film and then after planarization, the silicon nitride film and the pad oxide film are removed and a step in which after sacrificial oxidation is implemented through oxidizing-nitriding, ion implantation is performed, is provided. Since the HF resistance of the isolation film is improved by employing this method, divot formation is minimized. In addition, in a sixth aspect of the present invention, by oxidizing the trench insidewalls through oxidizing-nitriding, the surface area at the boundary with the Si substrate is strengthened to further inhibit formation of divots.

In a seventh aspect of the present invention, a semiconductor device manufacturing method comprising a step in which a pad oxide film and a silicon nitride film are formed on an Si substrate, a step in which a groove-like trench is formed through photolithography and etching, a step in which the insidewalls of the trench are oxidized by employing an oxidizing-nitriding method, a step in which the trench is filled with an insulating film and then after planarization, the silicon nitride film and the pad oxide film are removed and a step in which gate oxidation is implemented through oxidizing-nitriding and ion implantation is performed, is provided. A high degree of HF resistance is achieved and also the entire manufacturing process is shortened in addition to achieving an improvement in the reliability of the gate oxide film by employing this manufacturing method.

In a eighth aspect of the present invention, a semiconductor device manufacturing method comprising a step in which a pad oxide film constituted of a TEOS-type CVD oxide film is formed on an Si substrate, the pad oxide film thus formed is annealed through the RTA method and then a silicon nitride film is formed over the annealed pad oxide film, a step in which a groove-like trench is formed through photolithography and etching, a step in which the trench insidewalls are oxidized by employing an oxidizing-nitriding method, a step in which the trench is filled with an insulating film and then the silicon nitride film and the pad oxide film are removed after planarization and a step in which gate oxidation is implemented through oxidizing-nitriding and then ion implantation is performed, is provided. By using a CVD oxide film with low HF resistance to constitute the pad oxide film, the pad oxide film can be removed quickly, and since this results in a reduction in the quantity of embedded insulating film that is removed, divot formation is minimized.

In an ninth aspect of the present invention, a semiconductor device manufacturing method comprising a step in which a pad oxide film constituted of a TEOS-type CVD oxide film is formed on an Si substrate, the pad oxide film thus formed is annealed through the RTA method and then a silicon nitride film is formed over the annealed pad oxide film, a step in which photolithography and etching are performed and a sacrificial LOCOS is formed through oxidizing-nitriding, a step in which a groove-like trench is formed within the LOCOS area, through etching, a step in which the trench insidewalls are oxidized by employing an oxidizing-nitriding method, a step in which the trench is filled with an insulating film and then the silicon nitride film and the pad oxide film are removed after planarization and a step in which gate oxidation is implemented through oxidizing-nitriding and then ion implantation is performed, is provided. Since the oxide film containing nitrogen remains as part of the LOCOS, the HF resistance is improved to minimize divot formation. Furthermore, through the formation of the LOCOS, the corners of the edges of the active area become rounded to prevent a reduction in the thickness of the gate oxide film.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

The following is a detailed explanation of the preferred embodiments of the present invention, given in reference to the drawings. FIG. 1 presents sectional views of the semiconductor device manufacturing steps in the first embodiment of the present invention.

Figure 1A:
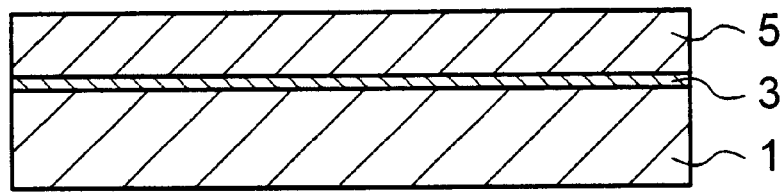
FIG. 1 presents sectional views of the semiconductor manufacturing steps in a first embodiment of the present invention.
Figure 1B:
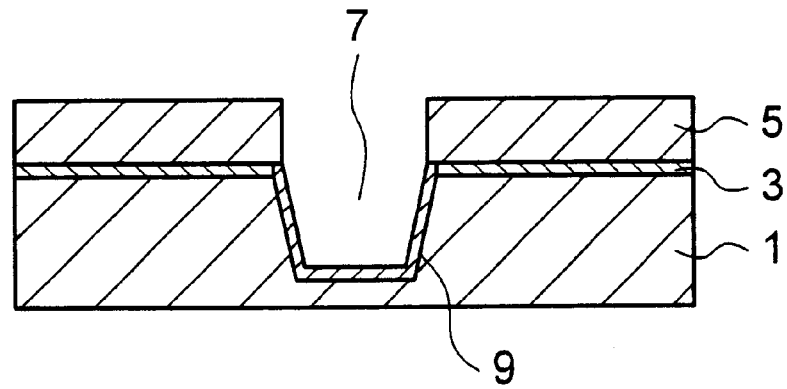
Figure 1C:
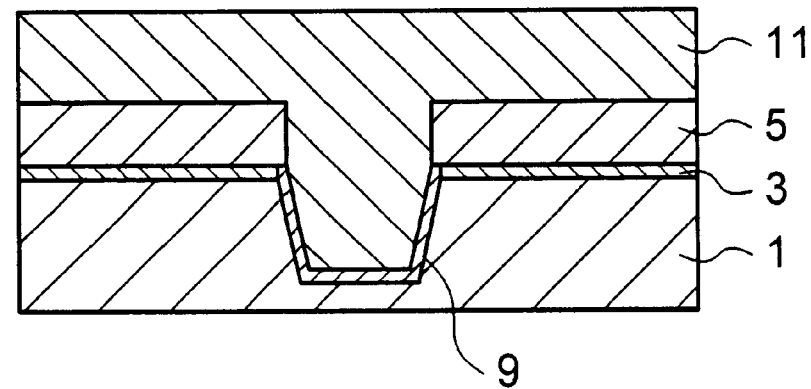
Figure 1D:
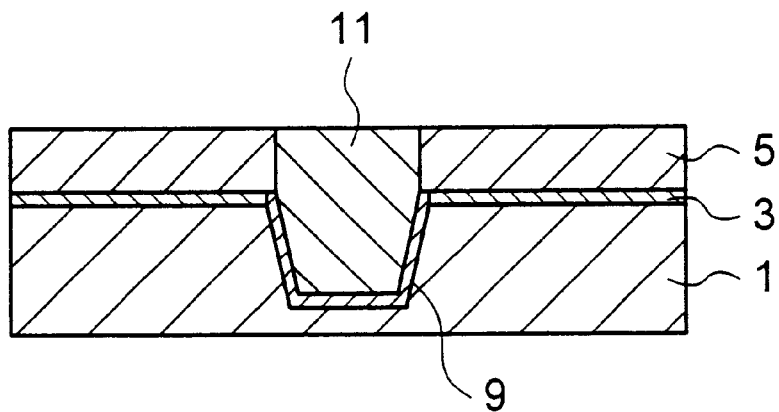
Figure 1E:
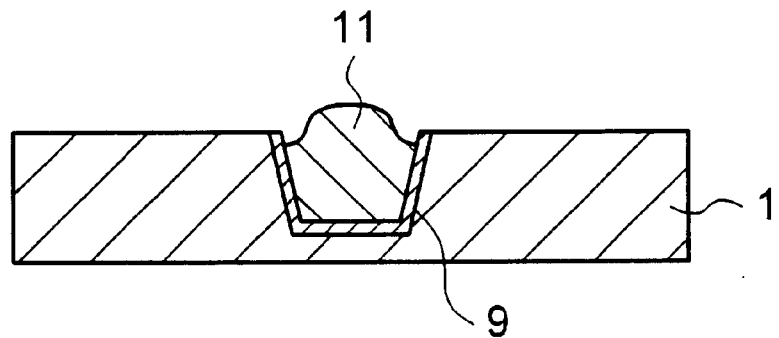

1) First, as illustrated in FIG. 1(a), a pad oxide film 3 is formed to a thickness of 100~300 angstroms on an Si substrate 1 in a wet O2 atmosphere at 850 degrees centigrade. Over the pad oxide film 3 thus formed, an Si3N4 film 5 is formed to a thickness of 1500~2000 angstroms through LPCVD (low pressure CVD).
2) Next, a photolithography process is performed and the Si3N4 film 5 is etched through the RIE (reactive ion etching) method. With a resist applied, the Si substrate 1 is etched by using the Si3N4 film 5 as a mask and the resist is removed to form a trench 7.
3) As shown in FIG. 1(b), a trench liner oxide film 9 is formed to a thickness of 300 angstroms by employing the RTA (rapid thermal anneal) method in which oxidizing/nitriding is performed by first implementing oxidation in an O2 atmosphere at 1050~1150 degrees centigrade, implementing nitriding in an NH3 atmosphere at 950~1050 degrees centigrade and implementing reoxidation in an N2O atmosphere at 1050~1150 degrees centigrade.
4) As illustrated in FIG. 1(c), the trench is filled with a CVD oxide film 11.
5) As illustrated in FIG. 1(d), the CVD oxide film 11 undergoes CMP (chemical-mechanical polishing) for planarization.
6) As illustrated in FIG. 1(e), a field area is formed by removing the Si3N4 film 5 and the pad oxide film 3.
7) Subsequently, a transistor is formed by implementing specific steps.

In this embodiment, the trench liner oxide film 9 is an oxide-nitride film that contains nitrogen. In an oxide film containing a specific quantity of nitrogen, the degree to which its internal structure becomes distorted can be lessened. As a result, compressive stress occurring in the trench liner oxide film 9 is reduced, and the stress occurring at the edge of the active area and the tensile stress imparted to the Si substrate 1 are also reduced. Consequently, since the occurrence of crystal defects formation in the Si substrate near the trench liner oxide is inhibited, the junction leak current is reduced. In addition, since accelerated diffusion of impurities in the vicinity of the sidewalls is minimized during the subsequent ion implantation and activation, a parasitic transistor is less likely to form and, ultimately, the occurrence of a kink is minimized. Furthermore, the HF resistance of the trench liner oxide film 9 containing nitrogen is improved. Thus, since the degree to which the edge becomes corroded during the subsequent HF process is reduced, divot formation is minimized.

FIG. 2 presents sectional views of the semiconductor manufacturing steps in the second embodiment of the present invention. A trench is formed as in the steps explained in (1) and (2) in the first embodiment. Then, as illustrated in FIG. 2(a), a trench liner oxide film 29 is formed through thermal oxidation implemented in a dry O2 atmosphere at 950~1050 degrees centigrade. Subsequently, steps similar to the steps (4)~(6) in the first embodiment are implemented. Those steps are illustrated in FIGS. 2(b), (c) and (d).

Figure 2A:
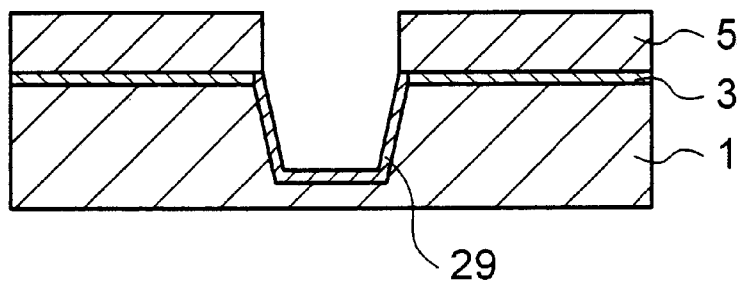
FIG. 2 presents sectional views of the semiconductor manufacturing steps in a second embodiment of the present invention.
Figure 2B:
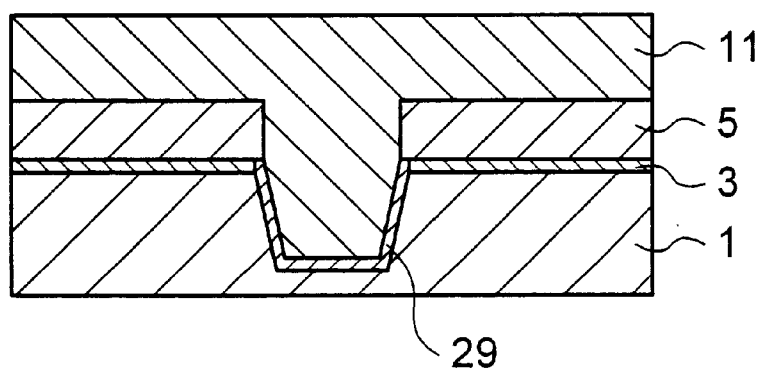
Figure 2C:
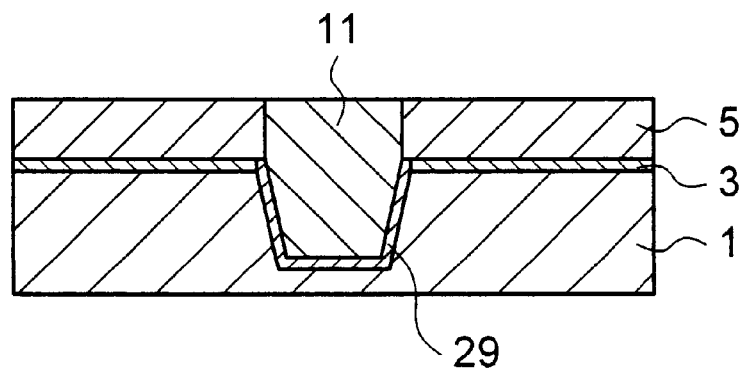
Figure 2D:
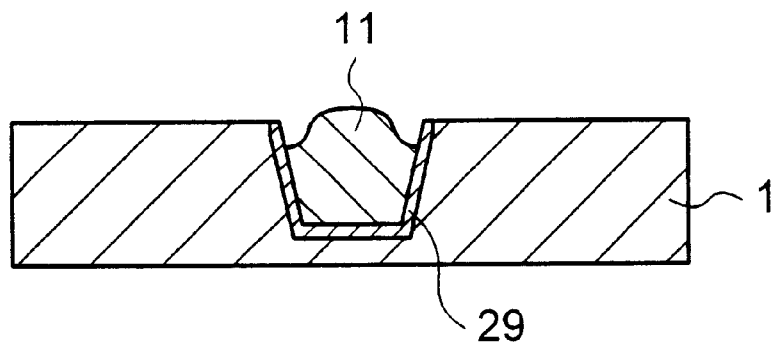
Figure 2E:
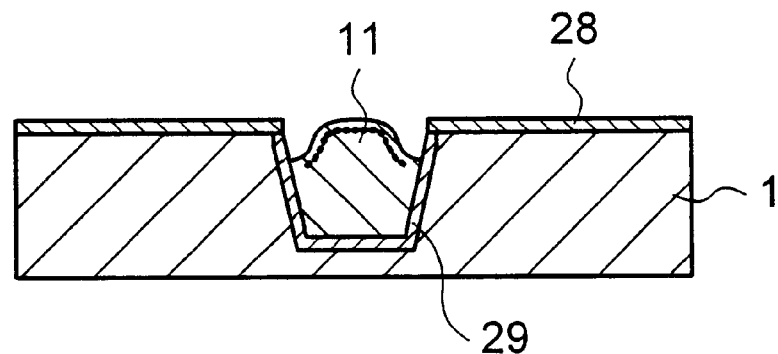

Next, as illustrated in FIG. 2(e), a sacrificial oxide film 28 is formed through oxidizing/nitriding performed under similar conditions to those adopted in the trench oxide film formation in the first embodiment, ion implantation is implemented to determine the threshold voltage of the transistor and activation annealing is performed. Then, transistor formation is implemented by performing specific steps such as gate electrode formation.

In this embodiment, an oxide-nitride film is formed in the active area on the Si substrate 1. As explained earlier, in an oxide film containing a specific quantity of nitrogen, the degree to which its internal structure becomes distorted can be lessened and, as a result, the stress occurring near the surface of the Si substrate 1 is reduced. Thus, accelerated diffusion of impurities is minimized during the subsequent ion implantation and activation to inhibit formation of a parasitic transistor and the occurrence of a kink. In addition, since a film containing nitrogen is formed at the surface of the CVD oxide film 11 during the sacrificial oxidation process, the HF resistance is improved compared to that of a standard CVD oxide film. Since this reduces the degree of corrosion of the CVD oxide film 11 occurring during the subsequent HF process, divot formed is minimized.

Figure 3A:
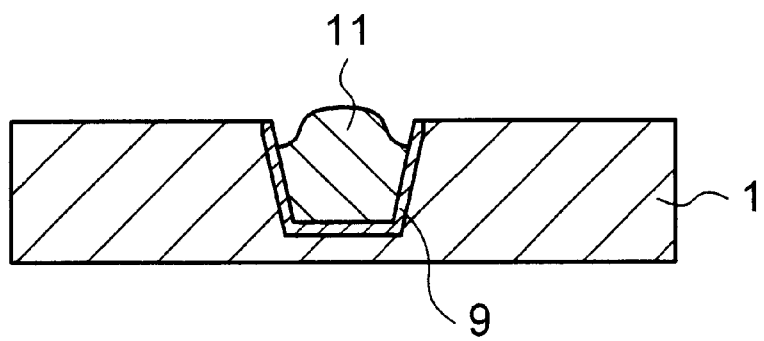
FIG. 3 presents sectional views of the semiconductor manufacturing steps in a third embodiment of the present invention.

FIG. 3 presents sectional views of the semiconductor device manufacturing steps in the third embodiment of the present invention. In this embodiment, a field area is formed by implementing steps similar to the steps (1)~(6) in the first embodiment. Since the manufacturing steps performed to form the field area are the same as those presented in FIG. 1, their illustration is omitted in FIG. 3. FIG. 3(a) corresponds to FIG. 1(e). Namely, the trench liner oxide film 9 in the third embodiment, too, is formed through oxidizing/nitriding implemented under conditions similar to those under which the trench liner oxide film 9 in the first embodiment is formed.

Figure 3B:
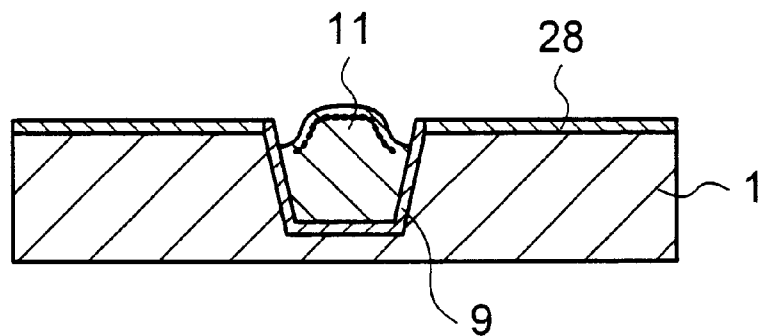

Next, as illustrated in FIG. 3(b), a sacrificial oxide film 28 is formed through oxidizing/nitriding performed under conditions similar to those under which the trench oxide film 9 in the first embodiment is formed, ion implantation is implemented to determine the threshold voltage of the transistor and then activation annealing is implemented. Then, a transistor is formed by implementing specific steps such as gate electrode formation.

This embodiment, in which the trench liner oxide film 9 and the sacrificial oxide film 28 are both constituted of an oxide-nitride film, incorporates the first embodiment and the second embodiment. As a result, advantages achieved in the two embodiments are realized. In particular, through the stress reducing effect explained earlier, accelerated diffusion of impurities is suppressed over a larger range. In addition, since both the trench liner oxide film .9 and the sacrificial oxide film 28 achieve an improvement in HF resistance, divot formation is prevented during subsequent HF processes even more effectively.

Figure 4A:
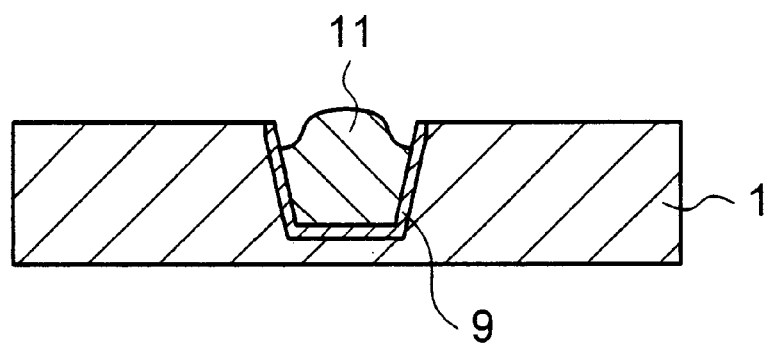
FIG. 4 presents sectional views of the semiconductor manufacturing steps in a fourth embodiment of the present invention.

FIG. 4 presents sectional views of the semiconductor device manufacturing steps in the fourth embodiment of the present invention. In this embodiment, a field area is formed by implementing steps similar to the steps (1)~(6) in the first embodiment. Since the manufacturing steps performed to form the field area are the same as those presented in FIG. 1, their illustration is omitted in FIG. 4. FIG. 4(a) corresponds to FIG. 1(e). Namely, the trench liner oxide film 9 in the fourth embodiment, too, is formed through oxidizing/nitriding implemented under conditions similar to those under which the trench liner oxide film 9 in the first embodiment is formed.

Figure 4B:
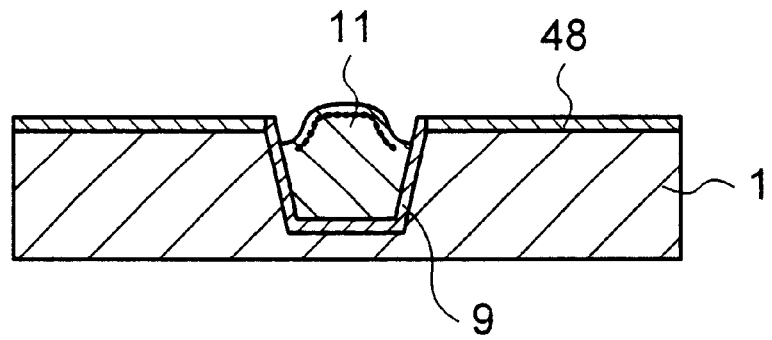
Figure 5A:
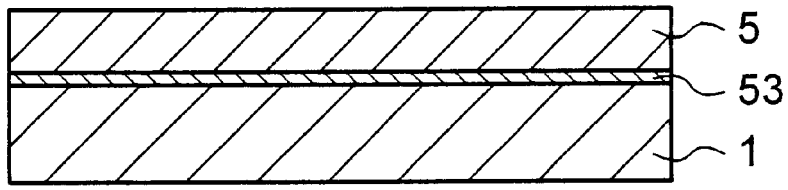
FIG. 5 presents sectional views of the semiconductor manufacturing steps in a fifth embodiment of the present invention.
Figure 5B:
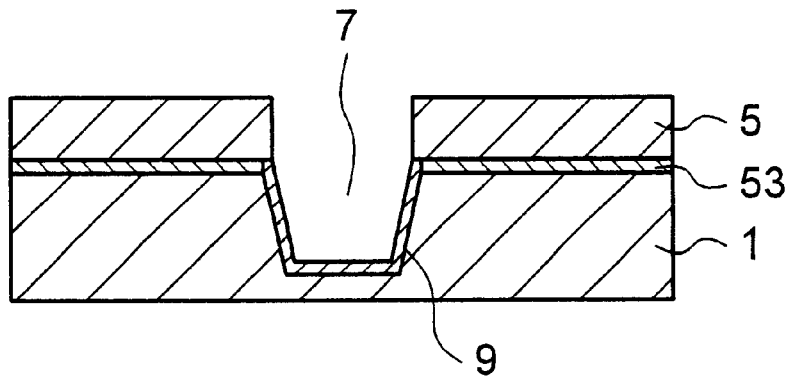
Figure 5C:
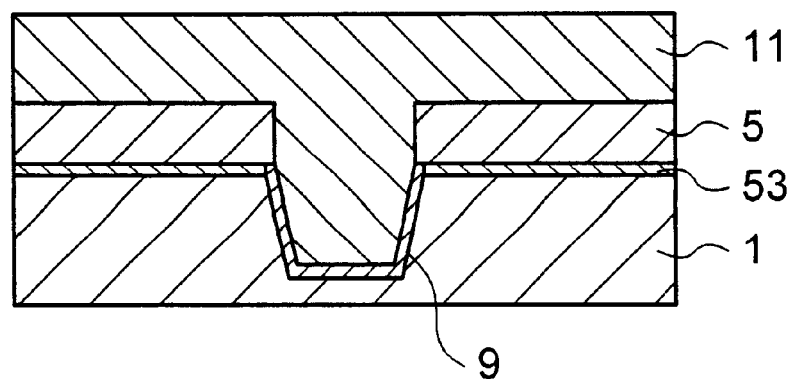
Figure 5D:
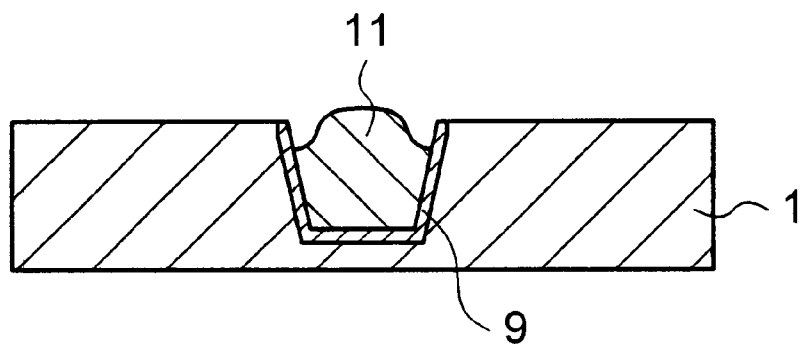
Figure 5E:
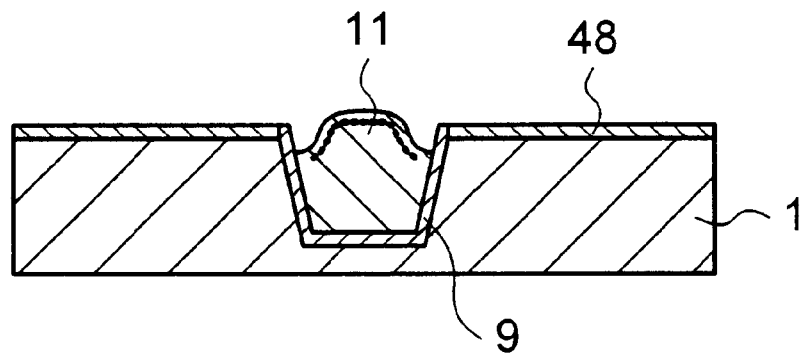
Figure 6A:
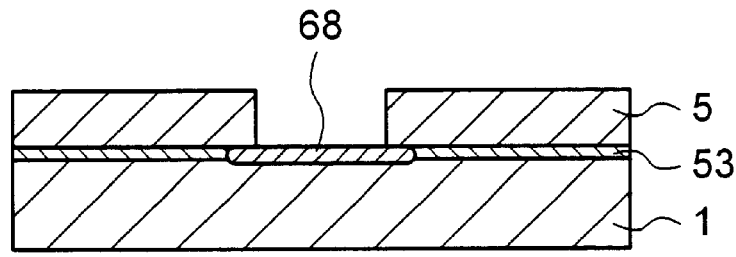
FIG. 6 presents sectional views of the semiconductor manufacturing steps in a sixth embodiment of the present invention.
Figure 6B:
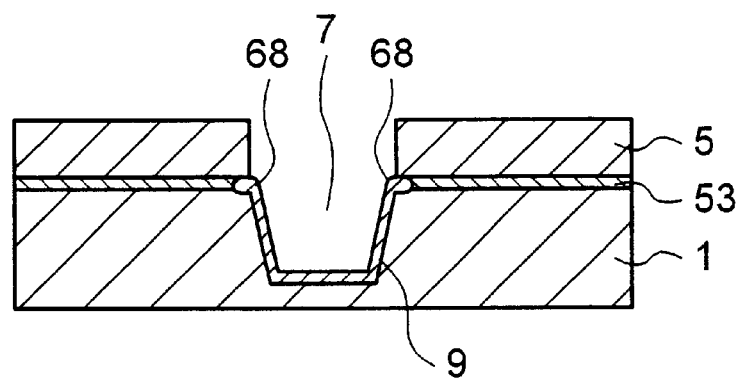
Figure 6C:
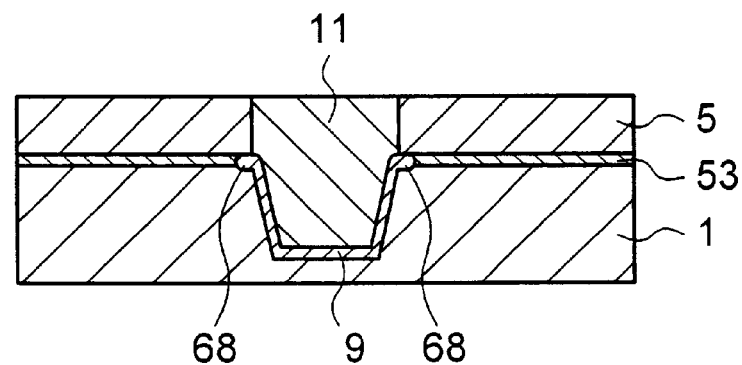
Figure 6D:
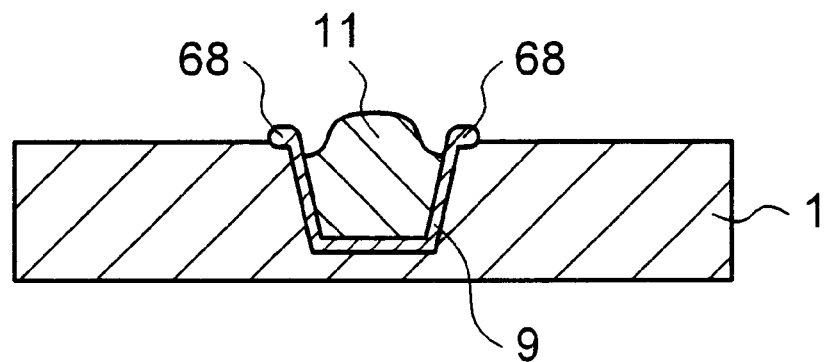
Figure 6E:
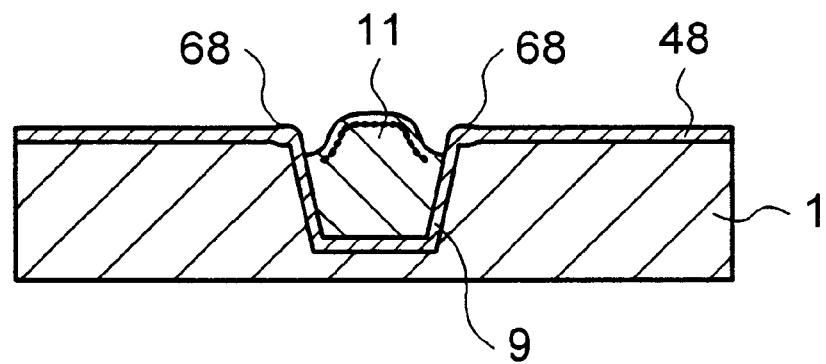
Figure 7A:
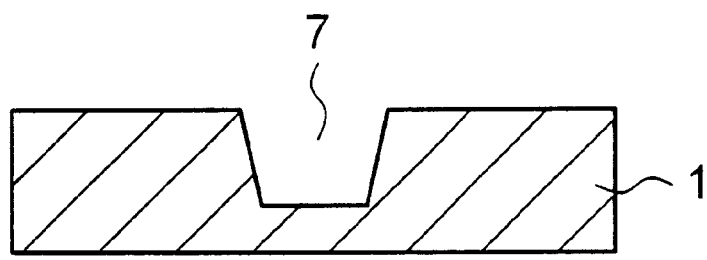
FIG. 7 illustrates the trench structure.
Figure 7B:
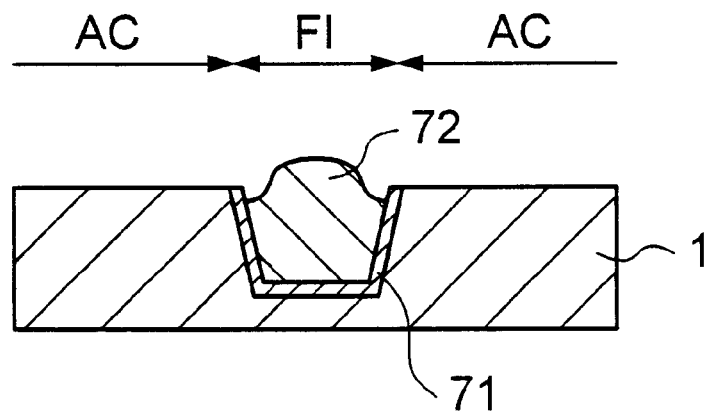
Figure 8:
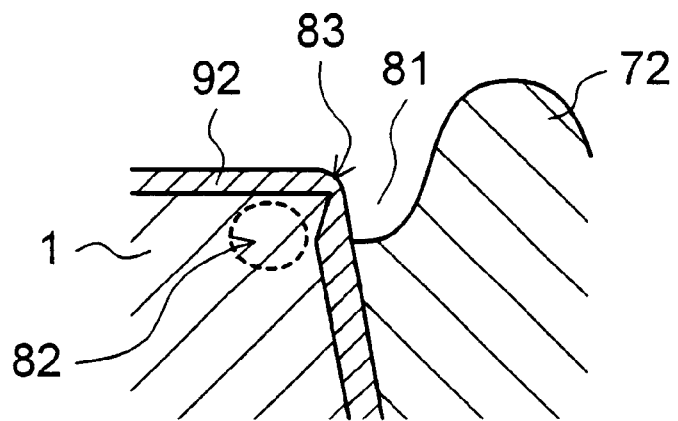
FIG. 8 is an enlarged view of the area around the edge of an active area.
Figure 9:
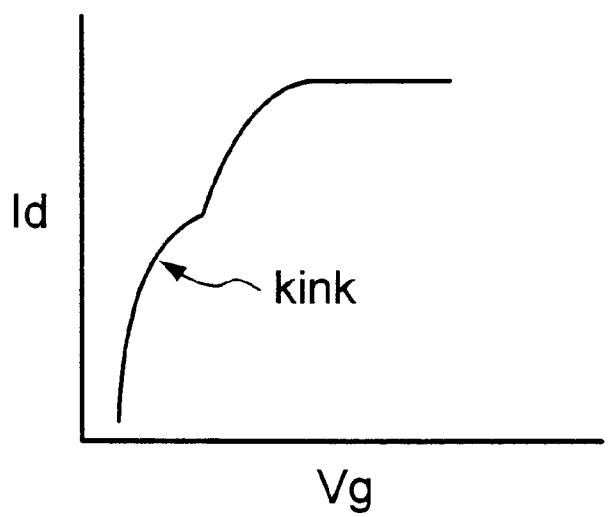
FIG. 9 is the transistor characteristics curve resulting from the formation of a parasitic transistor.

Next, as illustrated in FIG. 4(b), a gate oxide film 48 is formed through oxidizing/nitriding performed under conditions similar to those under which the trench oxide film 9 in the first embodiment is formed, ion implantation is implemented to determine the threshold voltage of the transistor and then activation annealing is implemented. Then, a transistor is formed by implementing specific steps.

It has been reported that through the reoxidation implemented during an oxidizing/nitriding process, the degree to which the thickness of a gate oxide film becomes reduced at an edge of a LOCOS is lessened. Since a similar effect is expected to manifest in a trench structure, the fourth embodiment, in which the gate oxide film 48 is formed through oxidizing/nitriding, achieves an advantage of improved reliability of the gate oxide film 48 in addition to the advantages of the third embodiment. In the manufacturing method in the prior art, sacrificial oxidation is implemented after a field oxide film is formed, ion implantation for determining the transistor threshold voltage is performed and the ions are activated, then the sacrificial oxide film is removed and then electrodes are formed after gate oxidation is performed to form a transistor. However, a in the fourth embodiment, the ion implantation for determining the transistors threshold voltage is performed over the gate oxide film 48 without implementing the sacrificial oxidation step. Thus, the number of manufacturing steps is reduced to save time and lower production costs, while achieving the advantage of improved HF resistance.

FIG. 5 presents sectional views of the semiconductor device manufacturing steps in the fifth embodiment of the present invention.

1) First, as illustrated in FIG. 5(*a*), a pad oxide film 53 constituted of a TEOS (tetra-ethyl-ortho-silicate) type CVD oxide film is formed to a thickness of 100~500 angstroms on an Si substrate 1. Then, the pad oxide film 53 is annealed in an N 2 atmosphere through the RTA method preferably at a temperature equal to the temperature at which the trench oxide film is formed, i.e., in the temperature range of approximately 1000~1050 degrees centigrade, to harden and tighten the CVD oxide film. Next, a Si3N4 film 5 is formed to a thickness of 1500~2000 angstroms through LPCVD.

2) A photolithography process is performed and the Si3N4 film 5 is etched through the RIE method. With a resist applied, the Si substrate 1 is etched by using the Si3N4 film 5 as a mask and the resist is removed to form a trench 7.

3) As shown in FIG. 5(*b*), a trench liner oxide film 9 is formed to a thickness of 300 angstroms by employing the RTA method implemented under conditions similar to those under which the trench oxide film is formed in the first embodiment.

4) As illustrated in FIG. 5(*c*), the trench is filled with the CVD oxide film 5) Next, CMP is performed for planarization.

6) As illustrated in FIG. 5(*d*), a field area is formed by removing the Si3N4 film 5 and the pad oxide film 53.

7) As illustrated in FIG. 5(*e*), a gate oxide film 48 is formed through oxidizing/nitriding implemented under conditions similar to those under which the trench oxide film 9 is formed in the first embodiment, an ion implantation for determining the transistor threshold voltage is performed and activation annealing is performed. Then, transistor formation is performed by following specific steps.

In this embodiment, a CVD oxide film with lower HF resistance compared to that of a thermal oxide film is used to constitute the pad oxide film 53 and, as a result, the HF process is implemented at a higher rate to achieve a reduction in the length of time required for removing the pad oxide film 53. In addition, since this results in a reduction in the degree to which the CVD oxide film 11 is corroded when the pad oxide film 53 is removed, divot formation is minimized.

FIG. 6 presents sectional views of the semiconductor device manufacturing steps in the sixth embodiment of the present invention. In this embodiment, after the first step in the fifth embodiment, a photolithography process is implemented and the Si3N4 film 5 is etched through the RIE method. Then, as illustrated in FIG. 6(*a*), a sacrificial LOCOS 68 is formed to a thickness of approximately 100~500 angstroms through oxidizing/nitriding implemented under conditions similar to those under which the trench liner oxide film 9 in the first embodiment is formed.

Next, a photolithography process is implemented, and as illustrated in FIG. 6(*b*), a trench 7 is formed through etching over a specific area in the LOCOS 68 that has been formed. Then, a trench liner oxide film 9 is formed by employing the RTA method, to a thickness of 300 angstroms through oxidizing/nitriding implemented under conditions similar to those under which the trench liner oxide film 9 is formed in the first embodiment.

Next, the trench is filled with a CVD oxide film 11 and, as illustrated in FIG. 6(*c*), CMP is performed for planarization. As illustrated in FIG. 6(*d*), the Si3N4 film 5 and the pad oxide film 53 are removed to form a field area. As shown in FIG. 6(*e*), a gate oxide film 48 is formed through oxidizing/nitriding as in the fifth embodiment, ion implantation is implemented to determine the transistor threshold voltage and activation annealing is performed. Then, specific steps are implemented to form a transistor.

During this process, the trench 7 may be formed after the sacrificial LOCOS 68 is formed by using the Si3N4 film 5 as a mask without implementing the photolithography process. In such a case, since the photolithography process is skipped, the manufacturing method is simplified.

In this embodiment, since the remaining portion of the LOCOS 68 formed as a sacrifice constitutes an oxide film containing nitrogen, which achieves a higher degree of HF resistance compared to a standard CVD oxide film, divot formation is inhibited even more effectively compared to the fifth embodiment. In addition, through the formation of the LOCOS 68, the comers of the edges of the active area are rounded to prevent a reduction in the film thickness of the gate oxide film 48.

While the invention has been particularly shown and described with respect to preferred embodiments of the semiconductor device and the semiconductor device manufacturing method according to the present invention by referring to the attached drawings, the present invention is not limited to these examples and it will be understood by those skilled in the art that various changes in form and detail may be made therein without departing from the spirit, scope and teaching of the invention.

As explained in detail above, according to the present invention, a semiconductor device that achieves a reduction in junction leak current and an improvement in the reliability of the gate oxide film by minimizing divot formation and the occurrence of a kink, and a method of manufacturing this semiconductor device are provided.

The entire disclosure of Japanese Patent Application No. 11-317024 filed on Nov. 8, 1999 including specification, claims, drawings and summary is incorporated herein by reference in its entirety.

What is claimed is:

1. A method of fabricating a semiconductor device, the method comprising:

provinding a substrate;

forming a pad oxide film and a silicon nitride film over the substrate;

forming a trench;

forming a liner oxide at least in the trench by an oxidizing step, an nitriding step and another oxidizing step; and substantially filling the trench with an insulating film, performing a planarizing step to remove the pad oxide and the silicon nitride film that are over the substrate.

2. A method of fabricating a semiconductor device, the method comprising:

providing a substrate;

forming a pad oxide film and a silicon nitride film over the substrate;

forming a trench;

forming a liner oxide at least in the trench by an oxidizing step;

substantially filling the trench with an insulating film, performing a planarizing step to remove the pad oxide and the silicon nitride film that are over the substrate;

forming a sacrificial oxide layer by performing an oxidizing step, a nitriding step and another oxidizing step; and performing an ion implantation step.

3. A method of fabricating a semiconductor device, the method comprising:

providing a substrate;

forming a pad oxide film and a silicon nitride film over the substrate;

forming a trench;

forming a liner oxide at least in the trench by an oxidizing step, an nitriding step and another oxidizing step; and substantially filling the trench with an insulating film, performing a planarizing step to remove the pad oxide and the silicon nitride film that are over the substrate; and forming a sacrificial oxide layer by performing an oxidizing step, a nitriding step and another oxidizing step.

4. A method of fabricating a semiconductor device, the method comprising:

providing a substrate;

forming a pad oxide film and a silicon nitride film over the substrate;

forming a trench;

forming a liner oxide at least in the trench by an oxidizing step, an nitriding step and another oxidizing step; and substantially filling the trench with an insulating film, performing a planarizing step to remove the pad oxide and the silicon nitride film that are over the substrate; and forming a gate oxide by an oxidizing step, a nitriding step and another oxidizing step.

5. A method of fabricating a semiconductor device, the method comprising:

providing a substrate;

chemical vapor depositing a TEOS pad oxide film over the substrate and annealing the pad oxide film by a rapid thermal anneal step forming a silicon nitride film over the pad oxide;

forming a trench;

forming a liner oxide at least in the trench by an oxidizing step, an nitriding step and another oxidizing step; and substantially filling the trench with an insulating film, performing a planarizing step to remove the pad oxide and the silicon nitride film that are over the substrate; and forming gate oxide layer by performing an oxidizing step, a nitriding step and another oxidizing step.

6. A method of fabricating a semiconductor device, the method comprising: providing a substrate;

chemical vapor depositing a TEOS pad oxide film over the substrate and annealing the pad oxide film by a rapid thermal anneal step forming a silicon nitride film over the pad oxide;

forming a sacrificial local oxidation of silicon layer by an oxidizing step, a nitriding step and another oxidizing step;

forming a trench;

forming a liner oxide at least in the trench by an oxidizing step, a nitriding step and another oxidizing step; and substantially filling the trench with an insulating film, performing a planarizing step to remove the pad oxide and the silicon nitride film that are over the substrate; and forming gate oxide layer by performing an oxidizing step, a nitriding step and another oxidizing step.

* * * * *